(12) United States Patent
Tomita et al.

(10) Patent No.: US 8,543,171 B2
(45) Date of Patent: Sep. 24, 2013

(54) DATA TRANSMISSION CIRCUIT AND ITS CONTROL METHOD

(75) Inventors: Masato Tomita, Kasugai (JP); Takashi Shimizu, Kasugai (JP); Hideaki Watanabe, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1279 days.

(21) Appl. No.: 12/199,298

(22) Filed: Aug. 27, 2008

(65) Prior Publication Data

US 2009/0129303 A1 May 21, 2009

(30) Foreign Application Priority Data

Aug. 30, 2007 (JP) ................................ 2007-224203

(51) Int. Cl.
*H04M 1/00* (2006.01)
(52) U.S. Cl.
USPC .............. 455/574; 455/569.1; 455/569.2; 455/570; 455/151.1; 455/152.1
(58) Field of Classification Search
USPC .............. 455/574, 569.1, 569.2, 570, 151.1, 455/152.1, 296, 297, 344, 345
See application file for complete search history.

(56) References Cited

U.S. PATENT DOCUMENTS

| 7,079,717 | B2 * | 7/2006 | Liu et al. .................... 385/14 |
| 2004/0133912 | A1 * | 7/2004 | Thomas et al. .............. 725/80 |
| 2005/0163457 | A1 * | 7/2005 | Liu et al. .................... 385/147 |
| 2010/0029242 | A1 * | 2/2010 | Orr et al. .................... 455/343.1 |

FOREIGN PATENT DOCUMENTS

| JP | 55-114042 | 9/1980 |
| JP | 59-036956 | 2/1984 |
| JP | 2000-180481 A | 6/2000 |
| JP | 2001-337756 | 12/2001 |
| JP | 2003-228444 | 8/2003 |
| JP | 2005-269556 | 9/2005 |

OTHER PUBLICATIONS

Foreign Office Action corresponding to Japanese Patent Application JP 2007-224203 dated Jul. 24, 2012.

* cited by examiner

*Primary Examiner* — Fayyaz Alam
(74) *Attorney, Agent, or Firm* — Arent Fox LLP

(57) ABSTRACT

A data transmission circuit transmitting an activation signal prior to a data signal through a signal transmission line, including: an activation detection signal generation unit for generating an activation detection signal by detecting the activation signal; and a wakeup signal generation unit for being activated by the activation detection signal, and generating a wakeup signal by detecting that the activation signal is transmitted for a predetermined time.

13 Claims, 10 Drawing Sheets

DATA TRANSMISSION CIRCUIT AND ITS CONTROL METHOD

CROSS-REFERENCE TO RELATED APPLICATION

This application is based upon and claims the benefit of priority of the prior Japanese Patent Application No. 2007-224203, filed on Aug. 30, 2007, the entire contents of which are incorporated herein by reference.

BACKGROUND

1. Field

The embodiments discussed herein are directed to a data transmission circuit and its control method.

2. Description of the Related Art

The Japanese Patent Laid-Open No. 2000-180481 discloses the technology of a multi-carrier modulation system for detecting a received signal (tone signal) of a single frequency signal. The technology of the Japanese Patent Laid-Open No. 2000-180481 refers to a single frequency signal detection apparatus for detecting each frequency of a received signal having a different frequency, and the apparatus includes level detection means for comparing a received signal with a threshold and detecting a level; pulse width measurement means for measuring a pulse width in detecting the level by the level detection means; clock/count means for counting the number of pulses corresponding to the pulse width measured by the pulse width measurement means; and frequency identification means for outputting a detection signal indicating a single frequency signal in a received signal from the number of pulses counted by the clock/count means.

In the technology of the Japanese Patent Laid-Open No. 2000-180481, the pulse width measurement means performs a masking process of not counting a pulse having a width shorter than the pulse set as a result of measuring a pulse width by the level detection means.

According to the technology of the Japanese Patent Laid-Open No. 2000-180481, a short pulse generated by noise is masked and not counted. Therefore, a tone signal can be surely detected from a received signal superposed by noise, thereby acquiring good detection features.

In addition, according to the technology of the Japanese Patent Laid-Open No. 2000-180481, only a comparator is designed to operate during standby, and the power consumption during standby can be reduced.

Meanwhile, in a recent vehicle-installed communication network, a tone signal is transmitted using the IEEE1394 standard with a plastic optical fiber (POF).

In addition, in a recent vehicle-installed communication control LSI, there is an increasing demand for reducing power consumption. Therefore, in the above-mentioned vehicle-installed communication control LSI, to reduce the power consumption during standby when an engine stops, for example, the current consumption of a reception unit of a tone signal transmitted by a POF is suppressed to be 20 μA or less.

However, while the data transmission rate of the POF is 200 Mbps, the data transmission rate of a copper wire is 400 Mbps. Therefore, it is desired to form a transmission line of a tone signal and a data signal through the copper wire to transmit a data signal at a higher speed while reducing the power consumption like the IEEE1394 standard using the POF.

On the other hand, as compared with the POF, a copper wire is subject to the effect of noise. Therefore, when a transmission line, such as the tone signal etc., is formed by a copper wire, it is considered that a reception unit of the vehicle-installed communication control LSI more easily receives a noise signal than when a transmission line of the tone signal etc. is formed by the POF. Therefore, the vehicle-installed communication control LSI erroneously recognizes that a tone signal has been received although the reception unit has actually received a noise signal. As a result, there is the possibility that a malfunction of transmitting a wakeup signal occurs in peripheral equipment coupled to the vehicle-installed communication control LSI.

SUMMARY

It is an aspect of the embodiments discussed herein to provide a data transmission circuit transmitting an activation signal prior to a data signal through a signal transmission line, including: an activation detection signal generation unit for generating an activation detection signal by detecting the activation signal; and a wakeup signal generation unit for being activated by the activation detection signal, and generating a wakeup signal by detecting that the activation signal is transmitted for a predetermined time.

These together with other aspects and advantages which will be subsequently apparent, reside in the details of construction and operation as more fully hereinafter described and claimed, reference being made to the accompanying drawings forming a part hereof, wherein like numerals refer to like parts throughout.

DETAILED DESCRIPTION OF THE EMBODIMENTS

Figure 1:
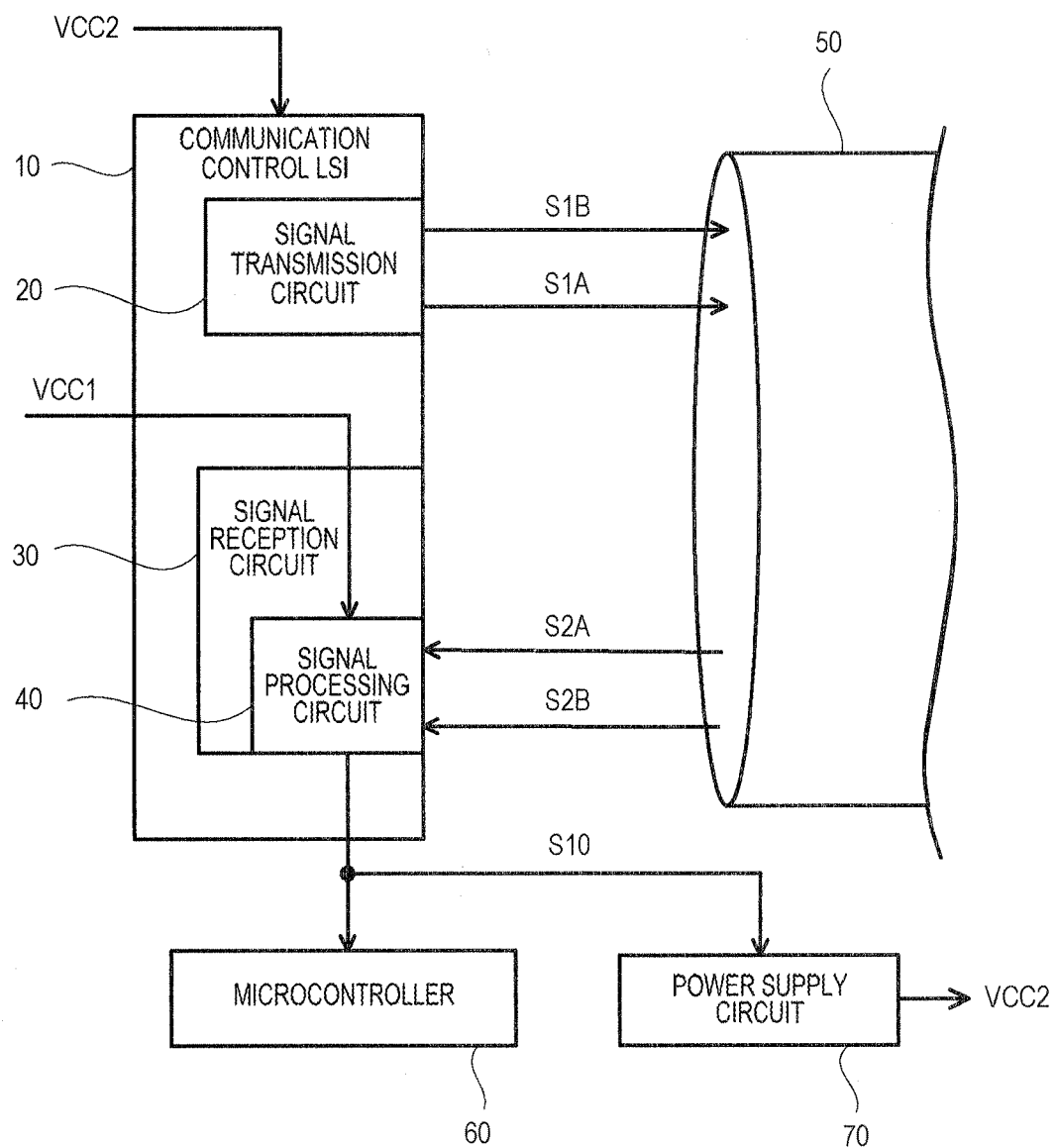
FIG. 1 illustrates an explanatory view of the transmission/reception state of a signal between the communication control LSI and the peripheral equipment.

An embodiment 1 is described below with reference to FIGS. 1 to 6. In this embodiment, a data transmission circuit is a signal processing circuit 40 loaded into a communication control LSI 10. FIG. 1 is an explanatory view of the transmission/reception state of a signal between a communication control LSI 10 and a peripheral equipment. The communication control LSI 10 is provided with a signal transmission circuit 20 and a signal reception circuit 30.

The signal transmission circuit 20 transmits differential data signals S1A and S1B to peripheral equipment (for example, a DVD player) via an IEEE1394 cable 50 coupled to the signal transmission circuit 20. In this example, the IEEE1394 cable 50 is formed by a copper wire cable. In the present embodiment, an IEEE1394 cable is attachable to and detachable from the signal transmission circuit 20 using an IEEE1394 socket.

The signal reception circuit 30 is provided with the signal processing circuit 40 capable of performing a low power consuming operation. The signal processing circuit 40 keeps a normal power supply state by a power supply voltage VCC1. In the signal processing circuit 40, the current consumption is controlled to be 20 μA or less in the standby state before receiving the differential tone signals S2A and S2B transmitted via the IEEE1394 cable 50. The IEEE1394 cable 50 can be attached to or detached from the signal processing circuit 40 using an IEEE1394 socket. The IEEE1394 cable 50 corresponds to the signal transmission line according to the present invention. The signal transmission line is a differential transmission line. The differential tone signals S2A and S2B correspond to the activation signal according to the present invention.

The signal processing circuit 40 generates a wakeup signal S10 as described later. The wakeup signal S10 is transmitted to a microcontroller 60 and a power supply circuit 70. After receiving the wakeup signal S10, the power supply circuit 70 provides a power supply voltage VCC2 for a communication control LSI10.

Figure 2:
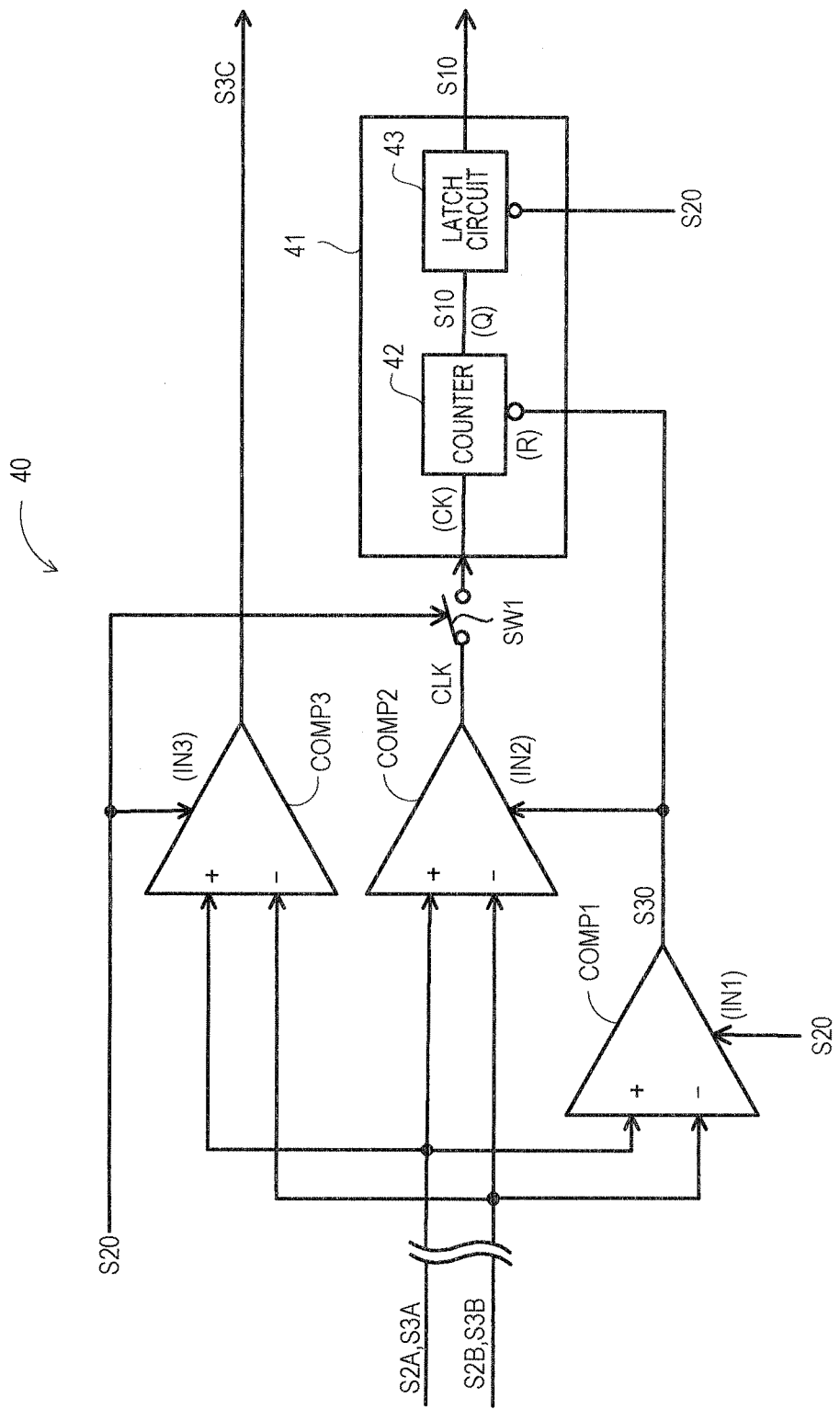
FIG. 2 illustrates the configuration of the signal processing circuit according to an embodiment 1.

FIG. 2 illustrates the configuration of the signal processing circuit 40. The signal processing circuit 40 corresponds to the data transmission circuit according to the present invention. The signal processing circuit 40 is provided with a comparator COMP1, a comparator COMP2, a switch SW1, a wakeup signal output unit 41, and a comparator COMP3. The comparator COMP2 and the wakeup signal output unit 41 correspond to the wakeup signal generation unit according to the present invention.

The non-inverting input terminal (+) and the inverting input terminal (−) of each of the comparators COMP1 to COMP3 are coupled to the IEEE1394 cable 50. A mode signal S20 is input to the power-down control terminal (IN1) of the comparator COMP1. The output of the comparator COMP1 is coupled to the power-down control terminal (IN2) of the comparator COMP2. Furthermore, the output of the comparator COMP1 is coupled to the reset terminal (R) of a counter 42 provided for the wakeup signal output unit 41.

The output of the comparator COMP2 is coupled to the clock terminal (CK) of the counter 42 through the switch SW1. The switch SW1 is opened and closed by the mode signal S20 generated in the signal processing circuit 40. The mode signal S20 is input to the power-down control terminal (IN3) of the comparator COMP3.

The wakeup signal output unit 41 is provided with a latch circuit 43 in addition to the counter 42. The input of the latch circuit 43 is coupled to the output terminal (Q) of the counter 42. The wakeup signal output unit 41 corresponds to the wakeup signal output unit according to the present invention.

Figure 3:
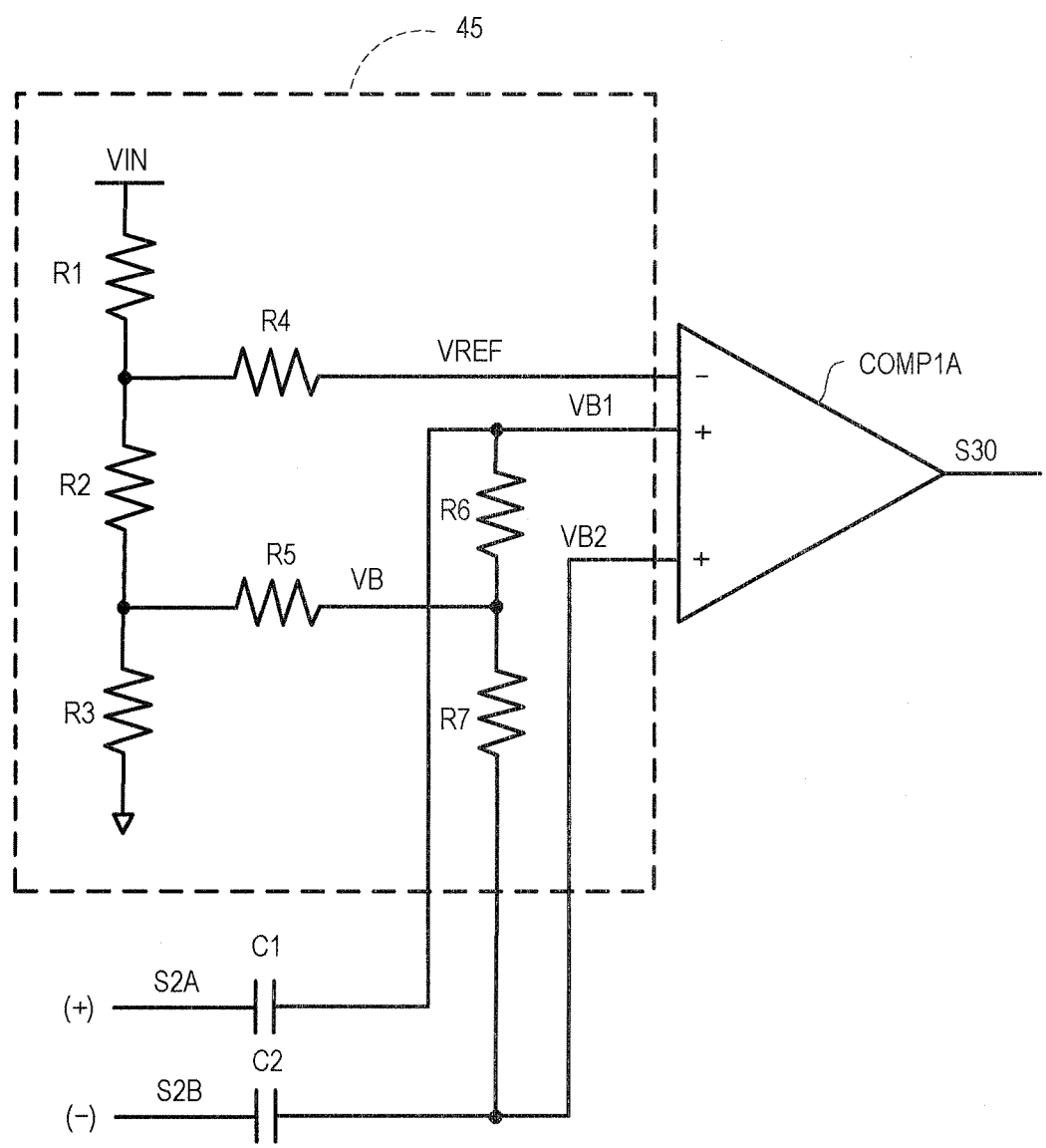
FIG. 3 illustrates the configuration of the comparator COMP1 according to the embodiment 1.

FIG. 3 illustrates the configuration of the comparator COMP1 shown in FIG. 2. The comparator COMP1 is provided with coupling capacitors C1 and C2, a level shift circuit 45, and a comparator COMP1A. According to the present embodiment, the comparator COMP1A corresponds to the comparison unit according to the present invention.

The coupling capacitor C1 is coupled between the first non-inverting input terminal (+) of the comparator COMP1A and the non-inverting input terminal (+) of the comparator COMP1. The coupling capacitor C2 is coupled between the second non-inverting input terminal (+) of the comparator COMP1A and the inverting input terminal (−) of the comparator COMP1.

Figure 4:
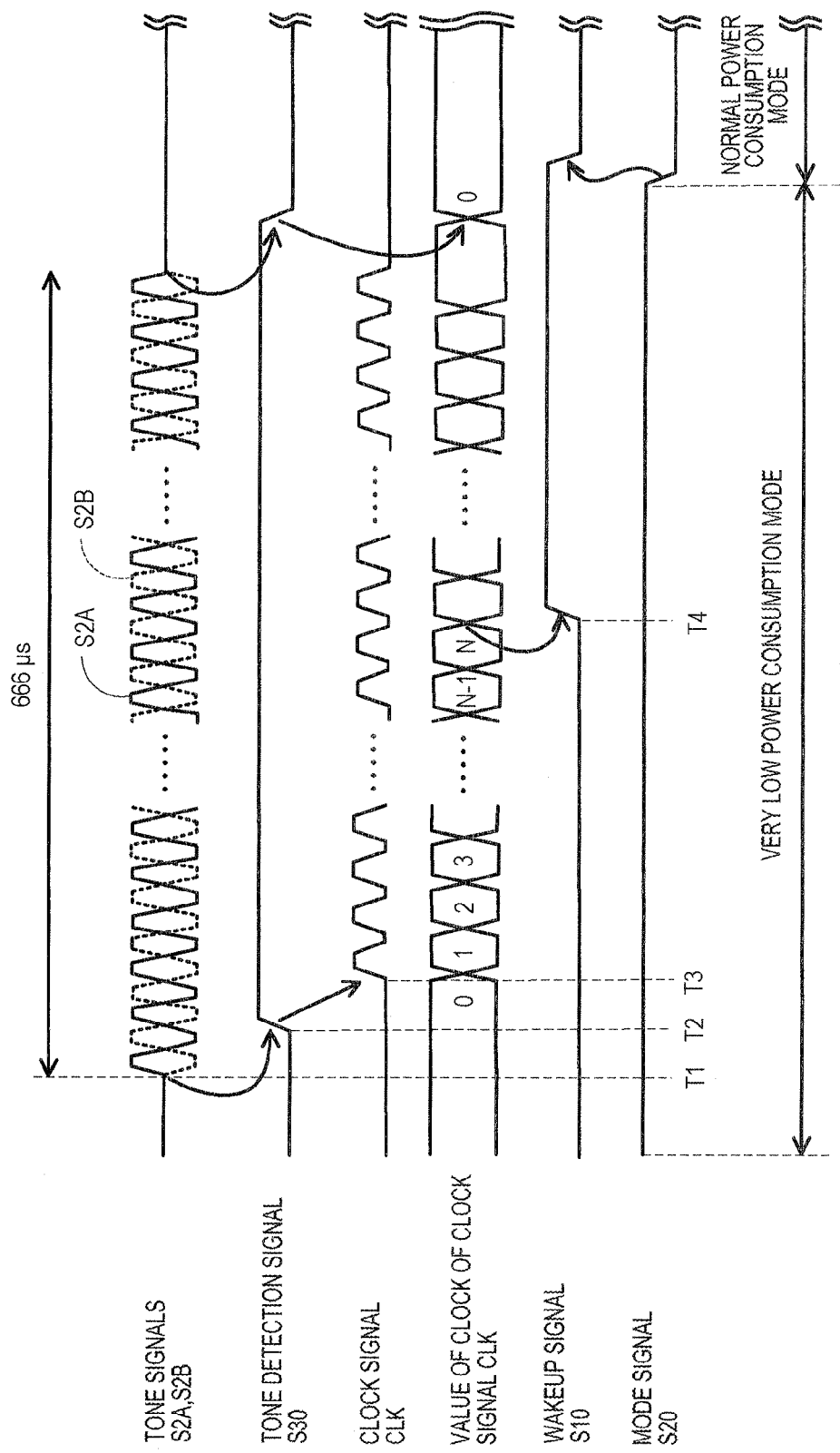
FIG. 4 illustrates a timing chart of the operation of the signal processing circuit.

Next, the operation of the signal processing circuit 40 according to the present embodiment is described. FIG. 4 illustrates a timing chart of the operation of the signal processing circuit 40. At a time before the time T1 shown in FIG. 4, the engine of a vehicle is in a stopped state (standby state), and the current consumption of the signal processing circuit 40 is set in the very low power consumption mode in which the current consumption of the signal processing circuit 40 is suppressed to be 20 μA or less. At time T1, the differential tone signals S2A and S2B are input respectively to the non-inverting input terminal (+) and the inverting input terminal (−) of the comparator COMP1 (refer to FIG. 2). The direct current components of the differential tone signals S2A and S2B are respectively cut off by the coupling capacitors C1 and C2. The differential tone signals S2A and S2B according to the present embodiment are 48 to 64 MHz in frequency, and 200 to 800 mV in amplitude. The differential tone signals S2A and S2B are signals whose polarity varies alternately and periodically. The differential tone signals S2A and S2B span a predetermined time (666 μm), and are transmitted to the non-inverting input terminal (+) and the inverting input terminal (−) of the comparator COMP1 via the IEEE1394 cable 50.

Then, in the level shift circuit 45 (refer to FIG. 3), resistors R1 to R3 divide a DC input voltage VIN, and generate a reference voltage VREF and a bias voltage VB. The bias voltage VB is added to the tone signals S2A and S2B to generate level shift voltages VB1 and VB2. The values of the level shift voltages VB1 and VB2 are raised to the allowed operation voltage values of the comparator COMP1A. Resistors R4 to R7 are used to suppress the fluctuation of the reference voltage VREF and the bias voltage VB. The bias voltage VB is also added to the tone signals S2A and S2B to generate the level shift voltages VB1 and VB2.

Figure 5:
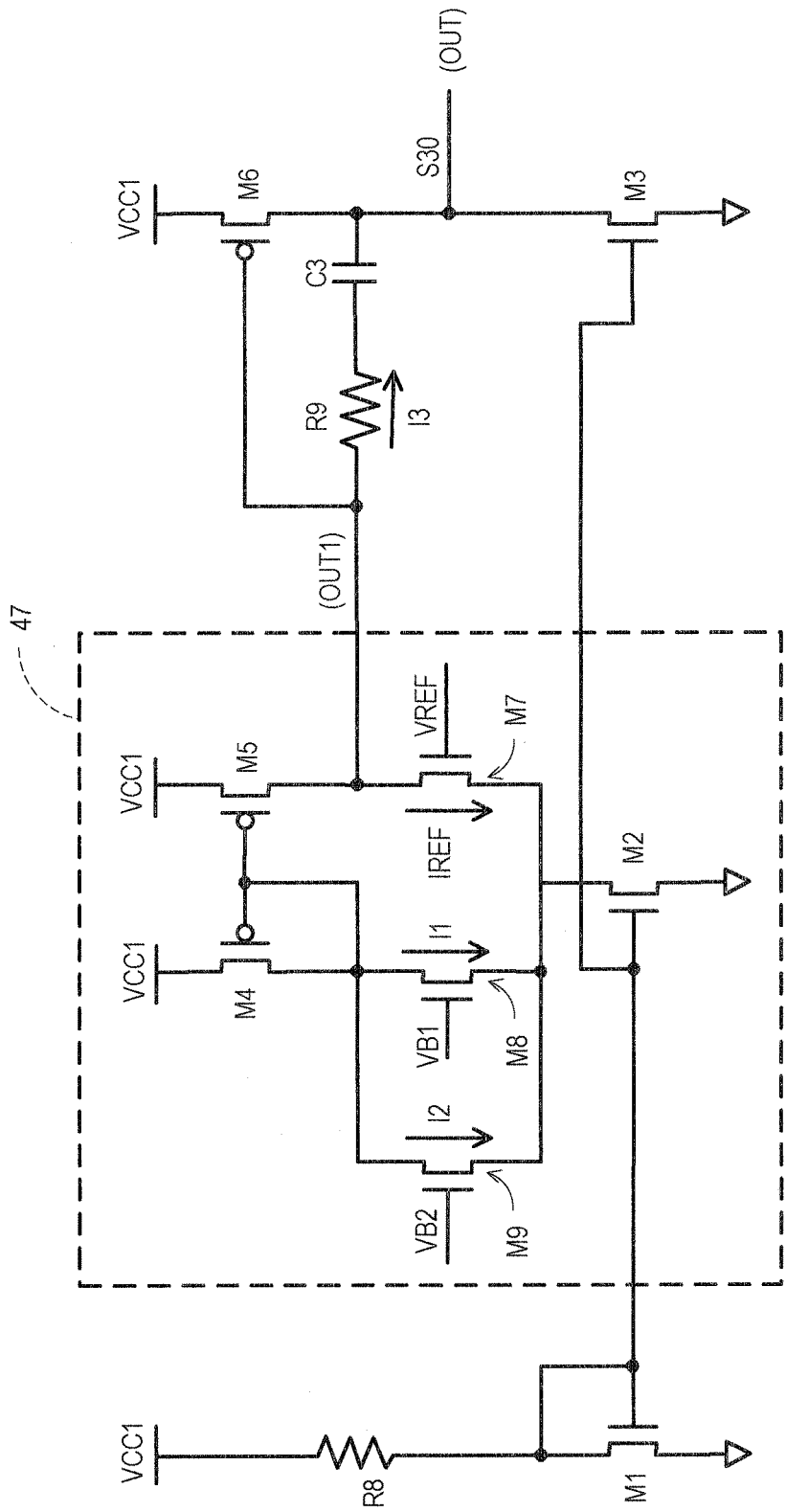
FIG. 5 illustrates the configuration of the circuit of the comparator COMP1A.

Then, the comparator COMP1A compares the reference voltage VREF with the level shift voltage VB1, and the reference voltage VREF with the level shift voltage VB2. FIG. 5 illustrates the configuration of the circuit of the comparator COMP1A. Comparing the reference voltage VREF with the level shift voltage VB1 and the reference voltage VREF with the level shift voltage VB2 corresponds to the comparing step of the present invention.

As shown in FIG. 5, the N-type channel transistors M1 to M3 form a current mirror circuit. Reference numeral R8 designates a resistor. P-type channel transistors M4 and M5, N-type transistors M7 to M9, and the N-type transistor M2 form a differentiation circuit 47. In addition, the output (OUT1) of the differentiation circuit 47 is coupled to the output (OUT) of the comparator COMP1A. The N-type transistor M3 is coupled to a power supply line for supplying a power supply voltage VCC1 through a P-type transistor M6. A resistor R9 and a capacitor C3 form a phase compensation circuit.

In the comparator COMP1A, the level shift voltage VB1 is applied to the gate of the N-type transistor M8. Furthermore, the level shift voltage VB2 is applied to the gate of the N-type transistor M9. The reference voltage VREF is applied to the gate of the N-type transistor M7. When the value of the level shift voltage VB1 or the value of the level shift voltage VB2 is larger than the value of the reference voltage VREF, the current I1 passing through the N-type transistor M8 or the current I2 passing through the N-type transistor M9 increases. Thus, the current I3 passes toward the output (OUT) through the output (OUT1) of the differentiation circuit 47. Therefore, as shown in FIG. 4, at time T2, the comparator COMP1 outputs a tone signal detection signal S30 through the output (OUT). Reference numeral IREF designates a current passing through the N-type transistor M7. In the present embodiment, the tone signal detection signal S30 corresponds to an activation detection signal. The comparator COMP1 corresponds to an activation detection signal generation unit. When the value of the level shift voltage VB1 or the value of the level shift voltage VB2 is larger than the value of the reference voltage VREF, outputting the tone signal detection signal S30 corresponds to an activation detection signal generating step.

The tone signal detection signal S30 is input to the power down control terminal (IN2) of the comparator COMP2 as shown in FIG. 2. When the tone signal detection signal S30 is input to the power down control terminal (IN2), the comparator COMP2 is released from the very low power consumption mode. Thus, the comparator COMP2 enters an operation state.

Then, the comparator COMP2 starts generating a clock signal CLK from the time T3 shown in FIG. 4 according to the differential tone signals S2A and S2B (refer to FIG. 2) input to the non-inverting input terminal (+) and the inverting input terminal (−). In the present embodiment, the comparator COMP2 corresponds to a clock signal generation unit. Generating a clock signal CLK according to the differential tone signals S2A and S2B corresponds to a clock signal generating step. Outputting a wakeup signal S10 according to the differential tone signals S2A and S2B to be transmitted via the IEEE1394 cable 50 corresponds to a wakeup signal generating step.

The switch SW1 is controlled to be closed by a high level mode signal S20 indicating the very low power consumption mode. Thus, the clock signal CLK is input to the clock terminal (CK) of a counter 42 provided for the wakeup signal output unit 41.

As shown in FIG. 2, the tone signal detection signal S30 is input to the reset terminal (R) of the counter 42. Thus, the counter 42 is released from the reset state. The counter 42 counts the clock value of the clock signal CLK until a predetermined count value (N in this example as shown in FIG. 4) is reached. The counter 42 corresponds to a count unit.

When the clock value of the clock signal CLK reaches N, the counter 42 outputs the wakeup signal S10 to a latch circuit 43 at time T4. The latch circuit 43 outputs by latch the wakeup signal 10. Outputting the wakeup signal S10 when the clock value of the clock signal CLK reaches N corresponds to a wakeup signal outputting step.

The latch circuit 43 is released from the latch by the low level mode signal S20 (refer to FIG. 4) indicating a normal power consumption mode. Thus, the wakeup signal S10 is not transmitted to the microcontroller 60 and the power supply circuit 70 (refer to FIG. 1).

In addition, as shown in FIG. 2, the high level mode signal S20 indicating the very low power consumption mode is input to the power-down control terminal (IN3) of the comparator COMP3. Thus, the comparator COMP3 enters the power-down state. Therefore, in the very low power consumption mode, the comparator COMP3 does not operate. The comparator COMP3 may be controlled in the power supply stop state in the very low power consumption mode.

On the other hand, when the low level mode signal S20 indicating the normal power consumption mode is input to the power-down control terminal (IN3), the comparator COMP3 enters the operation mode. Thus, a low level data signal S3A is input to the non-inverting input terminal (+), and a high level data signal S3B is input to the inverting input terminal (−), thereby allowing the comparator COMP3 to output a low level signal S3C. In addition, a high level data signal S3A is input to the non-inverting input terminal (+), and a low level data signal S3B is input to the inverting input terminal (−), thereby allowing the comparator COMP3 to output a high level signal S3C.

Figure 6:
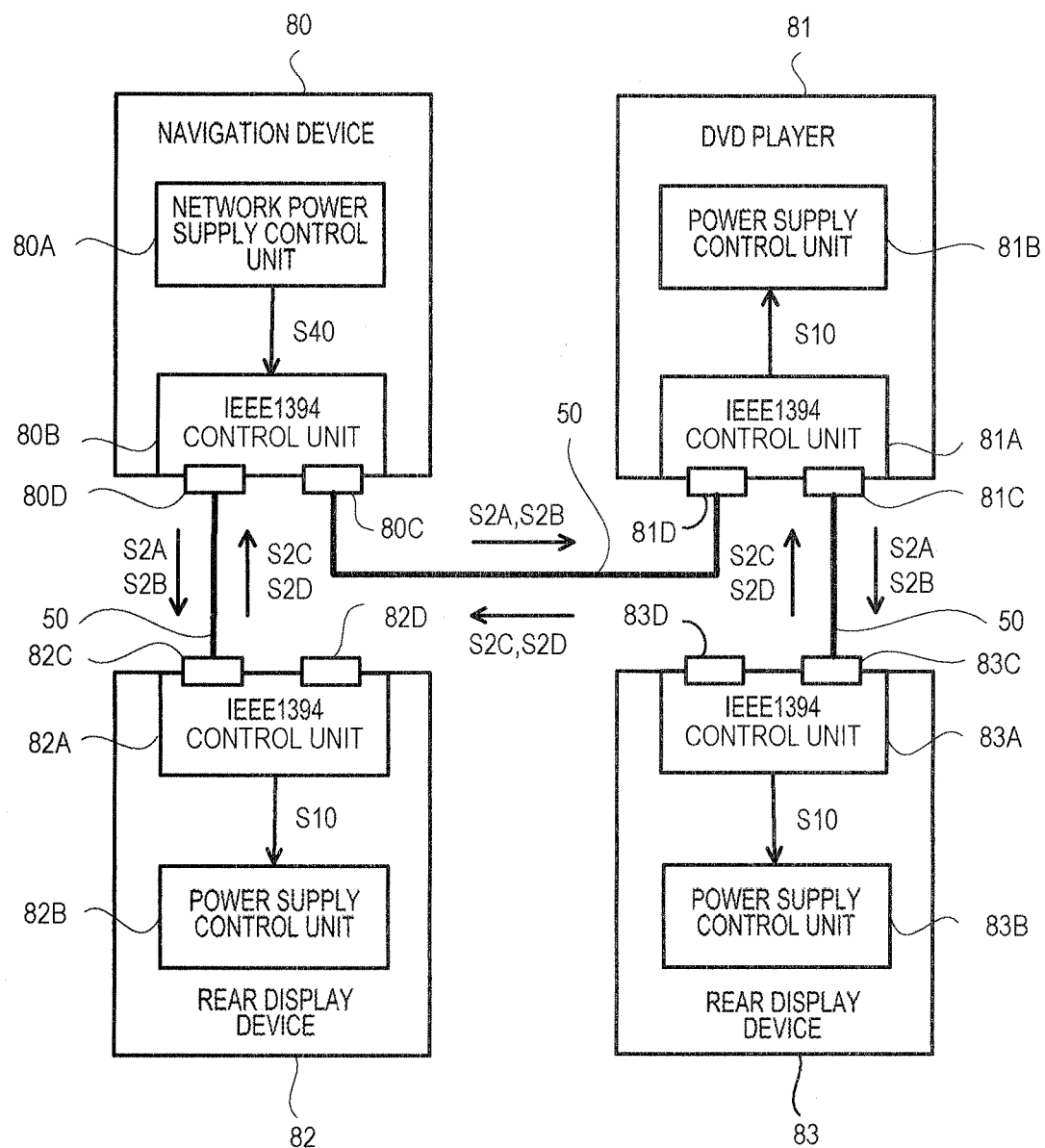
FIG. 6 illustrates an example of the configuration of the network to which the equipment provided with a communication control LSI is coupled.

With reference to FIG. 6, an example of the configuration of the network to which equipment provided with the communication control LSI10 is coupled is described below. FIG. 6 shows an example of configuring a network by a navigation device 80, a DVD player 81, and rear display devices 82 and 83.

The navigation device 80 is provided with a network power supply control unit 80A and an IEEE1394 control unit 80B. The IEEE1394 control unit 80B is provided with the above-mentioned communication control LSI10. Reference numerals 80C and 80D designate ports.

The DVD player 81 is provided with an IEEE1394 control unit 81A and a power supply control unit 81B. The IEEE1394 control unit 81A is provided with the communication control LSI10. Reference numerals 81C and 81D designate ports.

The rear display device 82 is provided with an IEEE1394 control unit 82A and a power supply control unit 82B. The IEEE1394 control unit 82A is provided with the communication control LSI10. Reference numerals 82C and 82D designate ports.

The rear display device 83 is provided with an IEEE1394 control unit 83A and a power supply control unit 83B. The IEEE1394 control unit 83A is provided with the communication control LSI10. Reference numerals 83C and 83D designate ports.

The port 80C of the IEEE1394 control unit 80B is coupled to the port 81D of the IEEE1394 control unit 81A through the IEEE1394 cable 50. The port 80D of the IEEE1394 control unit 80B is coupled to the port 82C of the IEEE1394 control unit 82A through the IEEE1394 cable 50. The port 81C of the IEEE1394 control unit 81A is coupled to the port 83C of the IEEE1394 control unit 83A.

Described below is the operation of the transition of each device configuring the network shown in FIG. 6 from the very low power consumption mode to the normal power consumption mode. In the network shown in FIG. 6, each device is set in the very low power consumption mode when the engine of a vehicle is stopped (standby state). When the ignition switch of the engine of a vehicle is turned on, the network power supply control unit 80A of the navigation device 80 is activated. Thus, the power is supplied to the navigation device 80. Furthermore, the network power supply control unit 80A transmits a wakeup signal S40 to the IEEE1394 control unit 80B.

Afterwards, the IEEE1394 control unit 80B transmits the differential tone signals S2A and S2B respectively to the IEEE1394 control unit 81A of the DVD player and the IEEE1394 control unit 82A of the rear display device 82 through the port 80C and the IEEE1394 cable 50.

The IEEE1394 control unit 81A outputs the wakeup signal S10 as described above with reference to the embodiment 1. The wakeup signal S10 is transmitted to the power supply control unit 81B. The power supply control unit 81B supplies power to the DVD player 81 by receiving the wakeup signal S10. In addition, the IEEE1394 control unit 81A transmits the tone signals S2C and S2D to the IEEE1394 control unit 80B through the port 81D and the IEEE1394 cable 50. The IEEE1394 control unit 80B confirms that a transmission line has been established between the navigation device 80 and the DVD player 81 by receiving the tone signals S2C and S2D.

Similar to the above-mentioned IEEE1394 control unit 81A, the IEEE1394 control unit 82A transmits the wakeup signal S10 to the power supply control unit 82B. Thus, the power supply control unit 82B supplies power to the rear display device 82. The IEEE1394 control unit 82A transmits the tone signals S2C and S2D to the IEEE1394 control unit 80B through the port 82C and the IEEE1394 cable 50 similar to the above-mentioned IEEE1394 control unit 81A.

Furthermore, the IEEE1394 control unit 81A transmits the tone signals S2A and S2B to the IEEE1394 control unit 83A of the rear display device 83 through the port 81C and the IEEE1394 cable 50.

The IEEE1394 control unit 83A transmits the wakeup signal S10 to the power supply control unit 83B. Thus, the power supply control unit 83B supplies power to the rear display device 83. The power supply control unit 83B transmits the tone signals S2C and S2D to the IEEE1394 control unit 81A through the port 83C and the IEEE1394 cable 50.

In the operation described above in the network shown in FIG. 6, a transmission line is established between the navigation device 80 and the rear display device 82, and a transmission line is also established from the navigation device 80 to the rear display device 83 through the DVD player 81. As a result, the transition operation from the very low power consumption mode to the normal power consumption mode is completed.

According to the signal processing circuit 40 and its control method of the present embodiment, the comparator COMP1 determines that the differential tone signals S2A and S2B have been input to the comparator COMP1 when the value of the level shift voltage VB1 or the value of the level shift voltage VB2 is larger than the value of the reference voltage VREF, and the comparator COMP1 outputs the tone signal detection signal S30. Since an operation power supply voltage is supplied by the tone signal detection signal S30 to the comparator COMP2, no operation power supply voltage is supplied in the standby state in which the differential tone signals S2A and S2B are not transmitted via the IEEE1394 cable 50, thereby generating no clock signal CLK. Furthermore, the wakeup signal output unit 41 does not output the wakeup signal S10 until the clock value of the clock signal CLK reaches a predetermined count value (N in this example). Therefore, in the standby state in which no clock signal CLK is generated, the wakeup signal output unit 41 does not output the wakeup signal S10. Therefore, since the comparator COMP2 and the wakeup signal output unit 41 generate no clock signal CLK or wakeup signal S10 in the standby state, the comparator COMP2 and the wakeup signal output unit 41 can reduce the amount of power consumption.

In addition, according to the signal processing circuit 40 and its control method of the present embodiment, when the counter 42 confirms that the clock value of the clock signal CLK has reached a predetermined count value (N in this example), the counter 42 of the wakeup signal output unit 41 outputs the wakeup signal S10. According to the signal processing circuit 40 and its control method of the present embodiment, unlike the periodic clock signal CLK, the wakeup signal output unit 41 does not output the wakeup signal S10 in response to the noise signal that is incidentally issued. Therefore, the wakeup signal output unit 41 can be prevented from erroneously recognizing a noise signal as the differential tone signals S2A and S2B and outputting the wakeup signal S10.

According to the signal processing circuit 40 and its control method of the present embodiment, the comparator COMP2 generates a clock signal CLK according to the differential tone signals S2A and S2B that periodically and alternately change in polarity. Then, the clock signal CLK generated by the comparator COMP2 can be allowed to periodically, alternately and repeatedly change its signal level (between a high level and a low level), thereby easily detecting the change in the signal level of the clock signal CLK.

Figure 7:
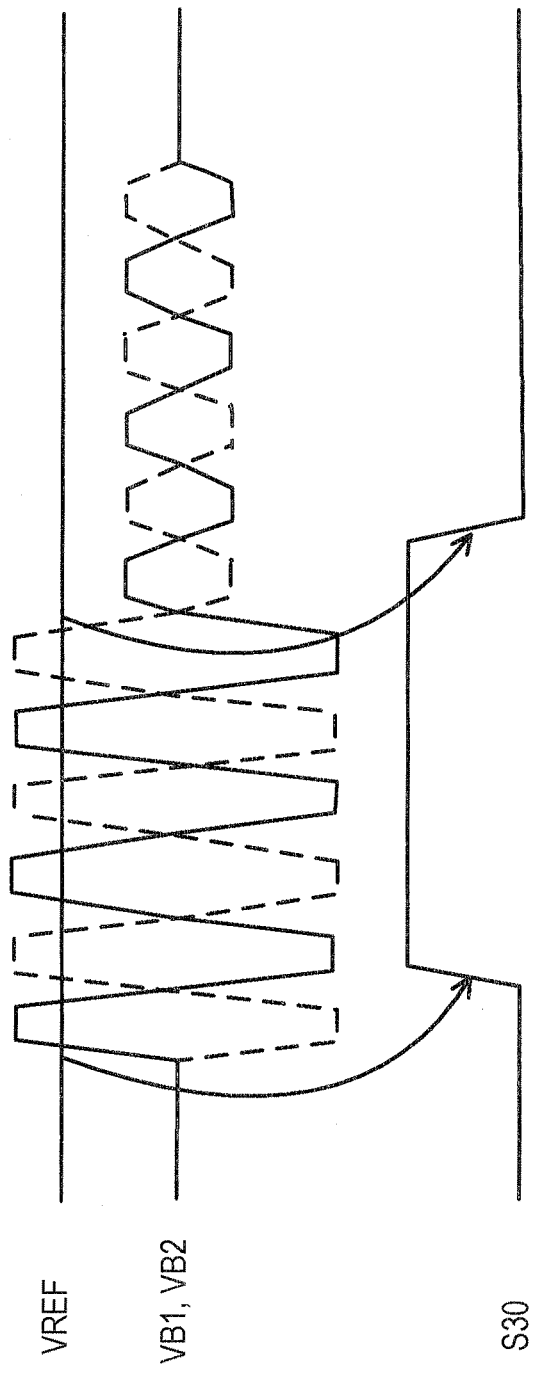
FIG. 7 illustrates a timing chart of the operation of the comparator COMP1.

According to the signal processing circuit 40 and its control method of the present embodiment, the comparator COMP1A provided for the comparator COMP1 compares each value of the level shift voltages VB1 and VB2 obtained by the level shift circuit 45 adding the bias voltage VB to the differential tone signals S2A and S2B with the value of the reference voltage VREF. Then, when the value of one of the level shift voltages VB1 and VB2 exceeds the value of the reference voltage VREF, the comparator COMP1A can detect the differential tone signals S2A and S2B, thereby improving the detection accuracy of the tone signals S2A and S2B. FIG. 7 illustrates a timing chart showing the operation of the comparator COMP1. The comparator COMP1 does not detect the differential tone signals S2A and S2B when the values of the level shift voltages VB1 and VB2 fall below the value of the reference voltage VREF. Therefore, as shown in FIG. 7, the level of the tone signal detection signal S30 becomes a low level.

According to the signal processing circuit 40 and its control method of the present embodiment, when the wakeup signal output unit 41 is provided with the counter 42 for counting the value indicating that the clock value of the clock signal CLK has reached N, unlike the periodic clock signal CLK, the counter 42 does not count N of the count value for the noise signal that is incidentally issued. Therefore, since the count value of the counter 42 does not reach N for the noise signal that is incidentally issued, the wakeup signal output unit 41 can be prevented from malfunctioning.

According to the signal processing circuit 40 and its control method of the present embodiment, since the differential data signals S1A and S1B are in accordance with the IEEE1394 standard, the data signals S1A and S1B can be transmitted at a high speed using the feature of the data transfer rate of the IEEE1394 standard.

According to the signal processing circuit 40 and its control method of the present embodiment, since the signal processing circuit 40 receives the differential tone signals S2A and S2B transmitted via the IEEE1394 cable 50, the maximum data transmission rate can be confirmed according to the tone signals S2A and S2B.

Figure 8:
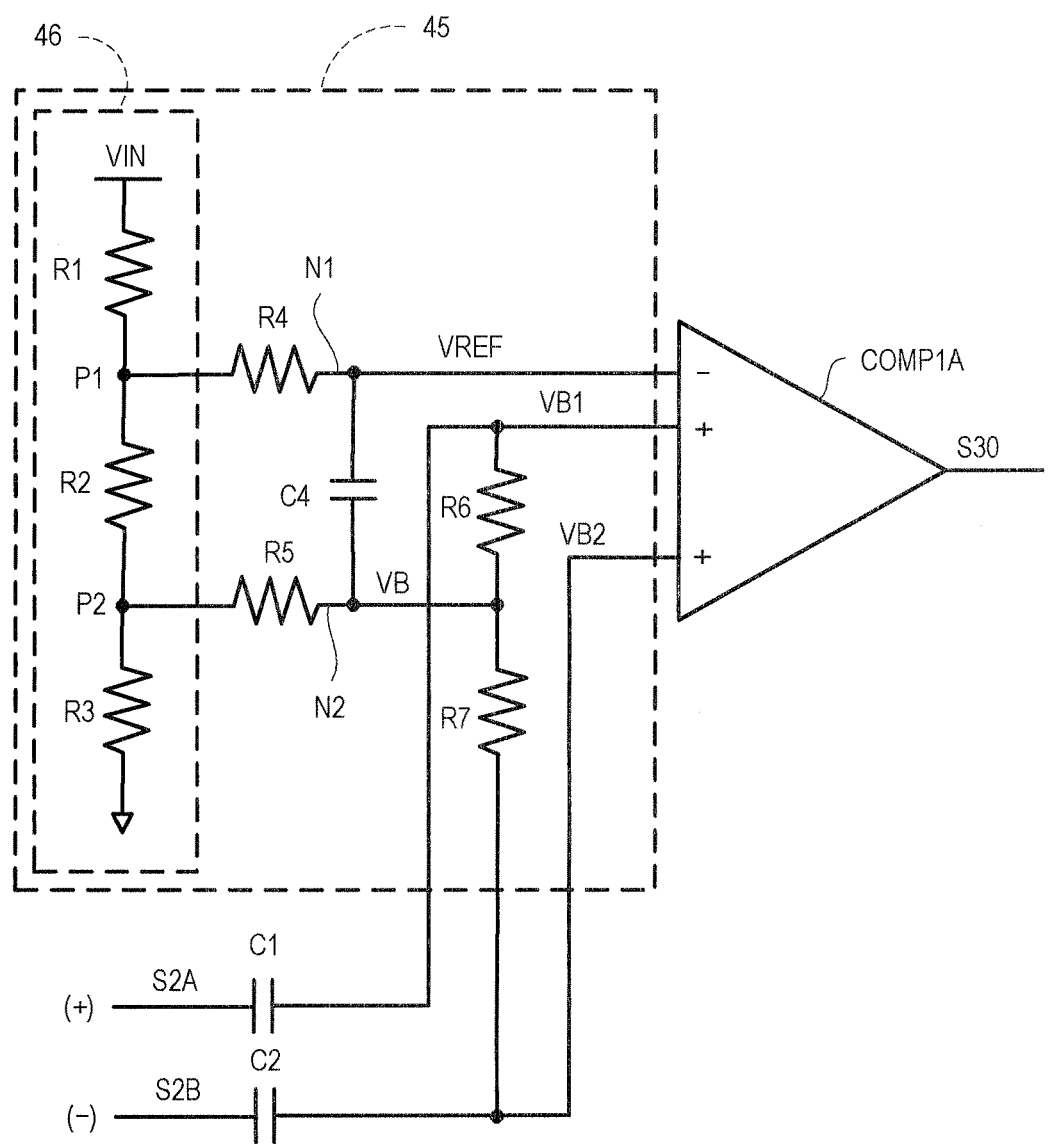
FIG. 8 illustrates the configuration of the comparator COMP1 of an embodiment 2.

The embodiment 2 is described below with reference to FIG. 8. In this example, the same configurations as in the embodiment 1 are assigned the same reference numerals, and the description is omitted here. FIG. 8 illustrates other embodiments of the comparator COMP1 shown in FIG. 2. The comparator COMP1 shown in FIG. 8 is provided with the capacitor C4 in addition to the configuration of the embodiment 1.

As shown in FIG. 8, the capacitor C4 is coupled between the node N1 and the node N2. The node N1 generates the reference voltage VREF. The node N1 is coupled between the connection point P1 to which the resistors R1, R2, and R3 are coupled and the inverting input terminal (−) of the comparator COMP1A. As described above, the resistors R1 to R3 divide the DC input voltage VIN and generate the reference voltage VREF. Therefore, the resistors R1 to R3 form a reference voltage generation circuit 46. The reference voltage generation circuit 46 corresponds to the reference voltage generation unit according to the present invention.

The node N2 generates the bias voltage VB. The node N2 is coupled between the connection point P2 to which the resistors R3, R2, and R1 are coupled and the non-inverting input terminal (+) of the comparator COMP1 to which the tone signal S2A is input. Furthermore, the node N2 is also coupled between the connection point P2 and the inverting input terminal (−) of the comparator COMP1 to which the tone signal S2B is input.

According to the present embodiment, when the node N1 for generating the reference voltage VREF is coupled to the node N2 for generating the bias voltage VB through the capacitor C4, even though a noise signal is superposed and the amplitude of the tone signals S2A and S2B changes, the voltage level of the reference voltage VREF can be synchronized with the fluctuation of the voltage level of the level shift voltages VB1 and VB2 obtained by adding the level shift voltage VB to the amplitude of the differential tone signals S2A and S2B. Then, the voltage level of the reference voltage VREF can be changed with a relative relationship with the voltage level of the level shift voltages VB1 and VB2. Therefore, the detection accuracy of the tone signals S2A and S2B can be prevented from lowering on the basis of the comparison result between the voltage level of the reference voltage VREF and the voltage level of the level shift voltages VB1 and VB2.

The present invention is not limited to the above-mentioned embodiments, but can be embodied by appropriately changing a part of the configuration within the gist of the present invention. For example, as in the signal processing circuit 40A shown in FIG. 9, the comparator COMP4 may be used in the same way as the comparator COMP2 and the comparator COMP3 shown in FIG. 2.

Figure 9:
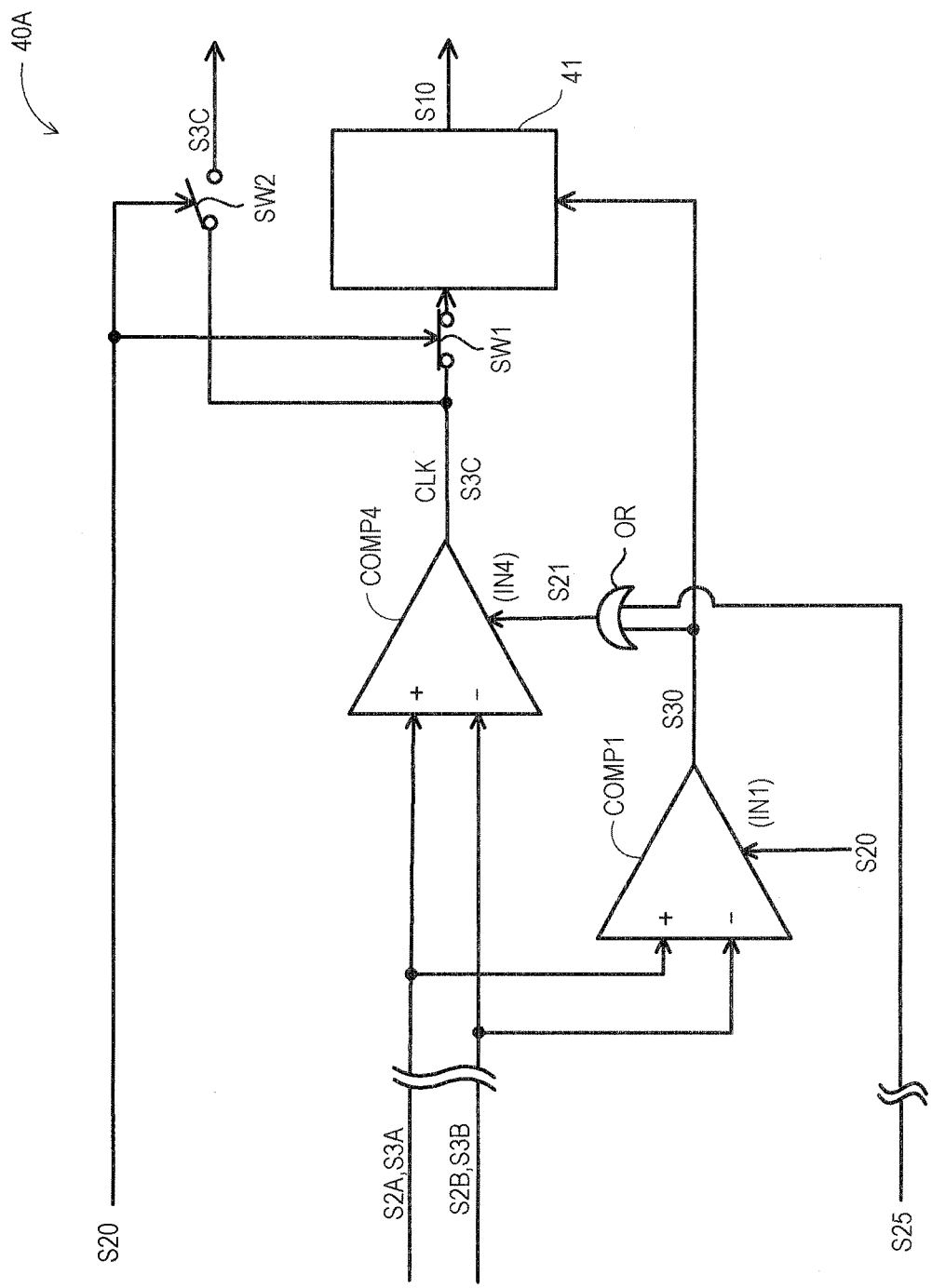
FIG. 9 illustrates the configuration of the signal processing circuit according to other embodiments.

In the signal processing circuit 40A shown in FIG. 9, the logical sum gate circuit OR outputs the logical sum signal S21 to the power-down control terminal (IN4) of the comparator COMP4. The tone signal detection signal S30 and the power-down control signal S25 for the normal power consumption mode are input to the logical sum gate circuit OR. In the signal processing circuit 40A, in the very low power consumption mode, the level of the power-down control signal S25 for the normal power consumption mode is fixed to the low level. Thus, in the very low power consumption mode, the power-down control of the comparator COMP4 is performed according to the tone signal detection signal S30. On the other hand, in the normal power consumption mode, the comparator COMP1 enters the power-down state according to the low level mode signal S20 indicating the normal power consumption mode. Therefore, the level of the tone signal detection signal S30 is fixed to the low level. Then, in the normal power consumption mode, the power-down control of the comparator COMP4 is performed according to the power-down control signal S25 for the normal power consumption mode.

Furthermore, the signal processing circuit 40A is also provided with the switch SW2 in addition to the switch SW1 (refer to FIG. 2). The switch SW2 is coupled between the output terminal of a data signal and the comparator COMP4. The switch SW2 is controlled in the open state in the very low power consumption mode according to the mode signal S20, and in the closed state in the normal power consumption mode.

According to the signal processing circuit 40A shown in FIG. 9, the comparator COMP4 is the same as the comparator COMP2 and the comparator COMP3 shown in FIG. 2. Therefore, compared to where the comparator COMP2 and the comparator COMP3 are separately provided, the area occupied by the signal processing circuit 40A can be smaller than the area occupied by the signal processing circuit 40 shown in FIG. 2.

Figure 10:
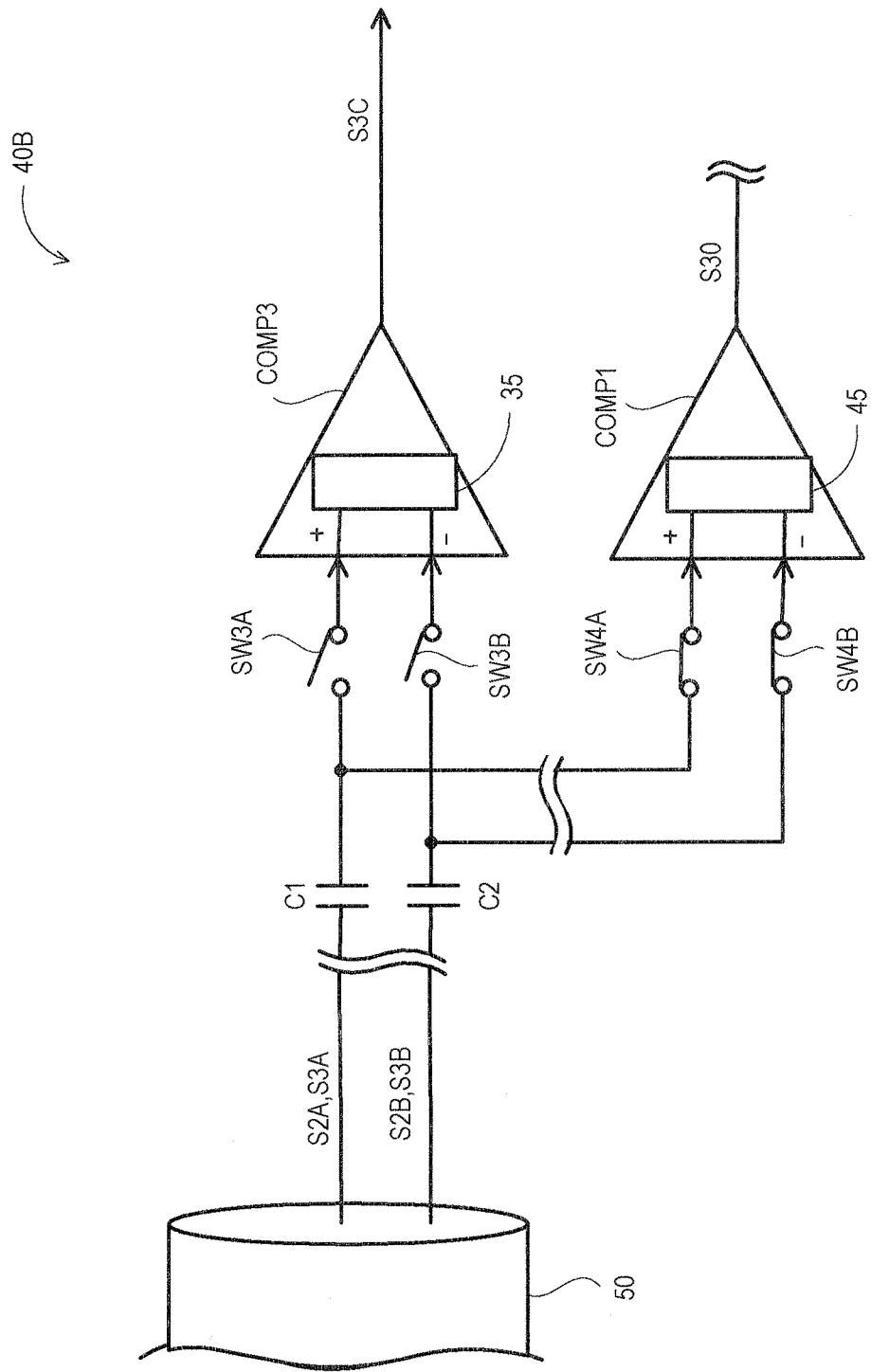
FIG. 10 illustrates the configuration of the circuit showing a part of the signal processing circuit according to other embodiments.

As with the signal generation circuit 40B shown in FIG. 10, switches SW3A and SW3B can be coupled between the comparator COMP3 and the IEEE1394 cable 50, and switches SW4A and SW4B can be coupled between the comparator COMP1 and the IEEE1394 cable 50.

Reference numeral 45 shown in FIG. 10 designates a level shift circuit shown in FIG. 3, and Reference numeral 35 designates a level shift circuit of the comparator COMP3. The level shift circuit 35 is configured like the level shift circuit 45. The resistor value used in the level shift circuit 35 is smaller than the resistor value used in the level shift circuit 45. Therefore, the current consumption of the level shift circuit 35 is larger than the current consumption of the level shift circuit 45.

In the signal generation circuit 40B, the switches SW3A and SW3B are controlled to be in the open state in the very low power consumption mode, and the switches SW4A and SW4B are controlled in the closed state according to the mode signal S20. In the normal power consumption mode, the switches SW3A and SW3B are controlled in the closed state, and the switches SW4A and SW4B are controlled in the open state according to the mode signal S20.

According to the signal generation circuit 40B shown in FIG. 10, to control the switches SW3A and SW3B in the closed state, and the switches SW4A and SW4B in the open state in the normal power consumption mode, the comparator COMP1 can be separated from the transmission line of the data signals S3A and S3B from the IEEE1394 cable 50 to the comparator COMP3. Then, the signal generation circuit 40B can reduce the load coupled to the transmission line of the data signals S3A and S3B, thereby limiting the attenuation of the high speed data signals S3A and S3B.

Furthermore, according to the signal generation circuit 40B, to control the switches SW3A and SW3B in the open state and the switches SW4A and SW4B in the closed state in the very low power consumption mode, the comparator COMP3 can be separated from the transmission line of the tone signals S2A and S2B from the IEEE1394 cable 50 to the comparator COMP1. Therefore, the level shift circuit 45 of the comparator COMP1 does not have an effect of the direct current depending on the bias voltage generated by the level shift circuit 35 of the comparator COMP3 in the signal generation circuit 40B. According to the signal generation circuit 40B, the bias voltage VB generated by the level shift circuit 45 of the comparator COMP1 can be prevented from being fluctuated by the effect of the direct current.

According to at least one embodiment of the data transmission circuit and its control method, no wakeup signal can be generated in the standby state in which no activation signals are transmitted. Furthermore, since a wakeup signal is generated by detecting that an activation signal is transmitted during a predetermined time, no wakeup signal is generated in the standby state in which no activation signal is transmitted. Thus, in the data transmission circuit according to at least one embodiment and its control method, no wakeup signal is generated in the standby state, and therefore the amount of power consumed when a wakeup signal is generated can be reduced.

In addition, according to at least one embodiment of the data transmission circuit and its control method, a wakeup signal is generated by detecting that activation signals are transmitted over a predetermined time. Therefore, unlike the activation signal detected over a predetermined time, no wakeup signal is generated in response to the noise signal that can be incidentally issued. Therefore, a wakeup signal can be prevented from being generated by erroneously recognizing a noise signal as an activation signal.

What is claimed is:

1. A data transmission circuit, comprising:
an activation detection signal generation unit for detecting an activation signal indicative of a data signal being transmitted through a signal transmission line, and generating an activation detection signal; and
a wakeup signal generation unit for receiving the generated activation detection signal, and generating a wakeup signal by detecting that the activation signal is transmitted for a predetermined time,
wherein the activation signal comprises a differential signal, and
the activation detection signal generation unit comprises:
a level shift unit for shifting a signal level of each of a plurality of signals configuring the differential signal to a predetermined level; and
a comparison unit for comparing the activation signal shifted by the level shift unit to the predetermined level with a reference voltage.

2. The data transmission circuit according to claim 1, wherein
the wakeup signal generation unit comprises:
a clock signal generation unit for generating a clock signal based on the activation signal; and
a wakeup signal output unit for outputting the wakeup signal by detecting that the clock signal is generated periodically for the predetermined time.

3. The data transmission circuit according to claim 2, wherein:
the activation signal is a periodic signal whose signal level is alternately and repeatedly changed; and
the clock signal generation unit generates the clock signal based on the periodic signal.

4. The data transmission circuit according to claim 1, wherein the level shift unit is coupled to a reference voltage generation unit for generating the reference voltage through a capacitor.

5. The data transmission circuit according to claim 2, wherein
the wakeup signal output unit comprises a count unit for detecting that a clock value of the clock signal exceeds a predetermined value.

6. The data transmission circuit according to claim 1, wherein the data signal is in accordance with an IEEE1394 standard.

7. The data transmission circuit according to claim 3, wherein the activation signal is a tone signal.

8. A method, comprising:
detecting an activation signal indicative of a data signal being transmitted through a signal transmission line, wherein the activation signal comprises a differential signal;
generating an activation detection signal in response to the detected activation signal, comprising:
shifting a signal level of each of a plurality of signals configuring the differential signal to a predetermined level, and
comparing the activation signal shifted to the predetermined level with a reference voltage; and
generating a wakeup signal by receiving the generated activation detection signal and detecting that the activation signal is transmitted for a predetermined time.

9. The method according to claim 8, wherein generating the wakeup signal comprises:
generating a clock signal according to the activation signal; and
outputting the wakeup signal by detecting that the clock signal is generated periodically for the predetermined time.

10. The method according to claim 9, wherein
the activation signal is a periodic signal whose signal level is alternately and repeatedly changed; and
the clock signal is generated based on the periodic signal when the clock signal is generated.

11. The method according to claim 9, further comprising detecting that a clock value of the clock signal exceeds a predetermined value when the wakeup signal is output.

12. The method according to claim 8, wherein the data signal is in accordance with an IEEE1394 standard.

13. The method according to claim 10, wherein the activation signal is a tone signal.

* * * * *